United States Patent [19]
Bergemont

[11] Patent Number: 5,484,741
[45] Date of Patent: Jan. 16, 1996

[54] METHOD OF MAKING INCREASED-DENSITY FLASH EPROM THAT REQUIRES LESS AREA TO FORM THE METAL BIT LINE-TO-DRAIN CONTACTS

[75] Inventor: Albert Bergemont, San Jose, Calif.

[73] Assignee: National Semiconductor Corporation, Santa Clara, Calif.

[21] Appl. No.: 439,306

[22] Filed: May 11, 1995

Related U.S. Application Data

[62] Division of Ser. No. 168,756, Dec. 16, 1993, Pat. No. 5,416,349.

[51] Int. Cl.[6] ............................................. H01L 21/8247
[52] U.S. Cl. .............................. 437/43; 437/49; 437/195
[58] Field of Search ................................ 437/43, 44, 49, 437/195, 978

[56] References Cited

U.S. PATENT DOCUMENTS

| | | | |
|---|---|---|---|
| 4,698,787 | 10/1987 | Mukherjee et al. | 365/185 |
| 4,720,323 | 1/1988 | Sato | 437/69 |
| 4,830,974 | 5/1989 | Chang et al. | 437/34 |
| 5,235,200 | 8/1993 | Komori et al. | 257/315 |
| 5,270,240 | 12/1993 | Lee | 437/195 |
| 5,371,030 | 12/1994 | Bergemont | 437/43 |
| 5,376,573 | 12/1994 | Richart et al. | 437/43 |

*Primary Examiner*—Chandra Chaudhari
*Attorney, Agent, or Firm*—Limbach & Limbach

[57] ABSTRACT

A series of self-aligned, intermediate strips of conductive material are formed to contact each of the drain regions in a corresponding number of columns of drain regions in a flash electrically programmable read-only-memory (EPROM). In addition, a corresponding series of metal bit lines are formed to periodically contact the series of intermediate strips of conductive material. By utilizing intermediate strips of conductive material which are self-aligned to the drains of the memory cells of the flash EPROM, the area required for each drain contact can be significantly reduced. By then utilizing the series of metal bit lines to periodically contact the series of intermediate strips, conventional techniques can be utilized to form the metal bit lines.

10 Claims, 17 Drawing Sheets

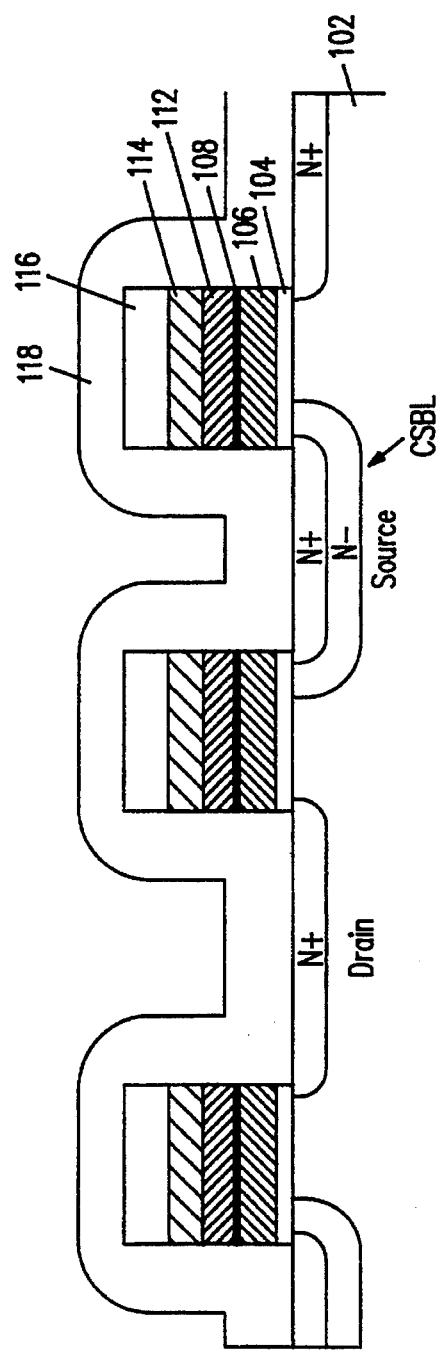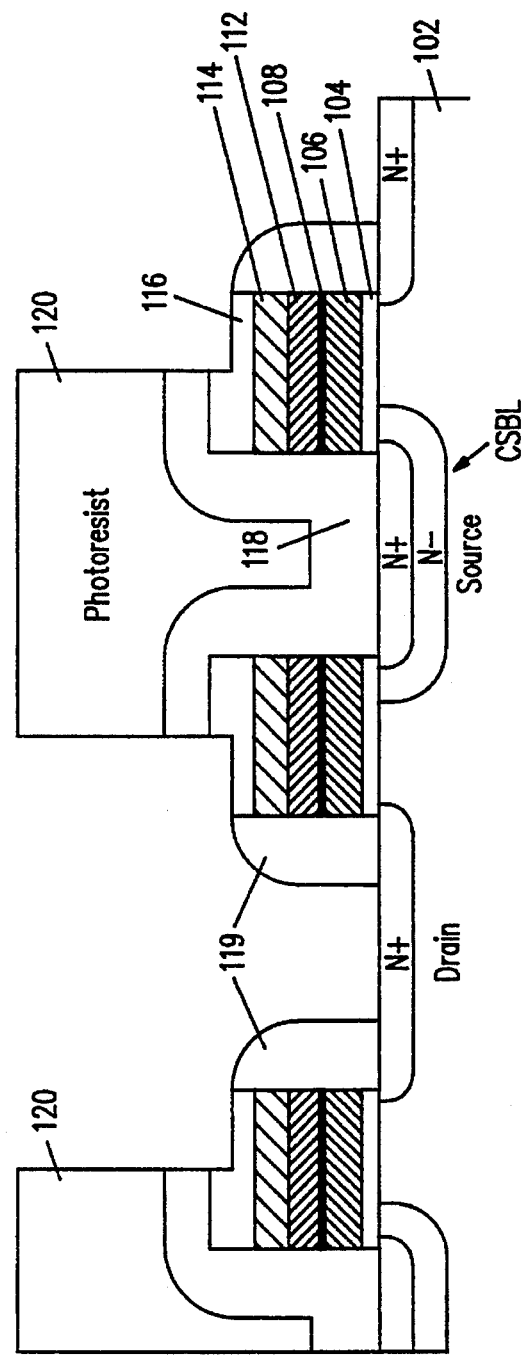

५,४८४,७४१

METHOD OF MAKING INCREASED-DENSITY FLASH EPROM THAT REQUIRES LESS AREA TO FORM THE METAL BIT LINE-TO-DRAIN CONTACTS

This is a divisional of application Ser. No. 08/168,756, now U.S. Pat. No. 5,416,349 filed Dec. 16, 1993.

BACKGROUND OF THE INVENTION

1. Field of the Invention

The present invention relates to a flash electrically programmable read-only-memory (EPROM) and, in particular, to an increased-density flash EPROM that requires less area to form the metal bit line- to-drain contacts.

2. Description of the Related Art

A flash electrically programmable read-only-memory (EPROM) is a non-volatile memory that, like conventional EPROMs and electrically-erasable, programmable, read-only-memories (EEPROMs), retains data which has been stored in the memory when power is removed. Although flash EPROMs are architecturally similar to conventional EPROMs and EEPROMs in a number of ways, one characteristic which differentiates flash EPROMs from conventional EPROMs and EEPROMs is that the metal bit lines of the array are utilized to directly contact the drain regions.

FIG. 1 shows a plan diagram of a portion of a conventional flash EPROM array. FIG. 2 shows a cross-sectional diagram taken along lines 1A—1A of FIG. 1. As shown in FIGS. 1 and 2, a conventional flash EPROM array includes a series of metal bit lines MBL1-MBLn which are formed so that each metal bit line MBL contacts each of the drain regions in one column of drain regions.

One of the major goals in the design of a flash EPROM array is to increase the density of the array. Historically, the density of flash EPROM arrays has been increased by reducing the dimensions of the individual cells of the array. One dimension which has proved to be particularly difficult to reduce in size, however, is the area required by each of the metal bit line-to-drain contacts.

The principle reason for this difficulty is the excess area which is required to compensate for any masking alignment error which can occur during the fabrication of the metal bit line-to-drain contacts. As shown in FIG. 2, the metal bit line-to-drain contacts are typically formed by forming a contact mask over a layer of insulation material ILD to define a series of metal contact openings, etching the unmasked portions of the layer of insulation material ILD until a portion of each drain region is exposed, depositing a layer of aluminum which forms the metal bit line-to drain contacts, and then masking and etching the layer of aluminum to form each of the individual metal bit lines.

As can be seen in FIG. 2, if the contact mask is misaligned, the subsequent etching of the layer of insulation material ILD can result in a portion of the word line and poly1 floating gate being etched away, thereby destroying the cell. As a result, the drain regions of the array must be formed to be larger than necessary to insure that, if the contact mask is misaligned, a portion of the word line and floating gate will not be etched away during the formation of the metal contact openings.

Another reason that it is difficult to reduce the area required by each of the metal bit line-to-drain contacts is that aluminum is a non-conformal material. Thus, as the area of the metal contact openings are reduced in size, the non-conformal nature of aluminum prevents the aluminum from reliably flowing into the metal contact openings and forming an electrical contact with the drain regions.

Therefore, there is a need for an increased-density flash EPROM that requires less area to form the metal bit line-to-drain contacts.

SUMMARY OF THE INVENTION

The present invention provides an increased-density flash EPROM that requires less area to form the metal bit line-to-drain contacts by utilizing a series of self-aligned, intermediate strips of conductive material which are formed so that each intermediate strip of conductive material directly contacts each of the drain regions in one column of drain regions. By utilizing intermediate strips of conductive material which are self-aligned to the drains of the memory cells of the array, the area required for each drain contact and, in turn, the area required by each memory cell, can be significantly reduced in size.

In accordance with the present invention, an increased-density flash EPROM includes a semiconductor substrate of P-type conductivity and a plurality of field oxide regions which are formed on the semiconductor substrate. A plurality of implanted channel regions and a plurality of N+ drain regions are formed in the semiconductor substrate so that a pair of implanted channel regions are formed between each pair of horizontally-adjacent field oxide regions, and so that each implanted channel region adjoins both of the adjacent field oxide regions. In addition, each implanted channel region has a first side and a second side. The plurality of N+ drain regions are formed so that each drain region adjoins the first side of each pair of implanted channel regions that are formed between each pair of horizontally-adjacent field oxide regions. A plurality of common source bit lines are also formed in the semiconductor substrate so that the second side of each implanted channel region formed in one row of implanted channel regions and the second side of each implanted channel region formed in an adjacent row of implanted channel regions are adjoined by one common source bit line. The flash EPROM further includes a layer of gate dielectric material which is formed on the semiconductor substrate. A plurality of stacked gate structures are formed on the layer of gate dielectric material so that each stacked gate structure is formed over one implanted channel region and a portion of each adjoining field oxide region. A plurality of word lines are formed on the field oxide regions and the stacked gate structures so that each word line is formed over and interconnects all of the stacked gate structures in one row of stacked gate structures. In addition, a layer of first insulation material is formed over each word line. The flash EPROM also includes a plurality of strips of second insulation material that are formed so that each strip of second insulation material is formed over one common source bit line. A plurality of strips of spacer material are formed so that each strip of spacer material covers a portion of each drain region and each horizontally-adjacent field oxide region in each row of drain regions, and adjoins one word line, the underlying stacked gate structures, and the overlying layer of first insulation material. A plurality of intermediate interconnect strips are formed over the strips of second insulation material, the strips of spacer material, the layers of first insulation material, and the drain regions so that each intermediate interconnect strip interconnects each drain region in one column of drain regions. The flash EPROM further includes a layer of third insulation material, which has a plurality of metal bit line openings formed through the layer of third insulation material, that is formed over the strips of second insulation material, the strips of spacer material, the word lines, the semiconductor substrate, and the intermediate interconnect strips so that each intermediate interconnect strip is periodically exposed by a metal bit line opening. A plurality of metal bit lines are formed over the layer of third insulation material and the exposed portion of each intermediate interconnect strip so that each metal bit line interconnects the exposed portions of one intermediate interconnect strip.

The present invention also includes a method for forming the flash EPROM which begins with the provision of a semiconductor substrate of P-type conductivity. Following this, a plurality of field oxide regions are formed on the semiconductor substrate. Next, a plurality of first implanted channel regions are formed in the semiconductor substrate so that a pair of first implanted channel regions are formed between each pair of horizontally-adjacent field oxide regions, and so that each first implanted channel region adjoins both of the adjacent field oxide regions. Each implanted channel region has a first side and a second side. The method of the present invention continues with the sequential formation of a layer of first gate dielectric material on the semiconductor substrate, a layer of first conductive material over the layer of first gate dielectric material, and a layer of intermediate dielectric material over the layer of first conductive material. After this, the layer of intermediate dielectric material and the layer of first conductive material are etched to define a plurality of strips of dielectric/conductive material. Next, a layer of second conductive material is formed over the strips of dielectric/conductive material, the field oxide regions, and the semiconductor substrate, followed by the formation of a layer of third conductive material over the layer of second conductive material, and a layer of first insulation material over the layer of third conductive material. Following this, the layer of first insulation material, the layer of third conductive material, and the layer of second conductive material are etched to form a plurality of word lines. After this, the layer of intermediate dielectric material and the layer of first conductive material are etched to form a plurality of floating gate memory cells. Next, a plurality of N+ buried drain regions and a plurality of common source bit lines are formed in the semiconductor substrate so that each drain region adjoins the first side of each pair of implanted channel regions. The plurality of common source bit lines are formed so that a common source bit line adjoins the second side of each implanted channel region formed in one row of implanted channel regions and the second side of each implanted channel region formed in an adjacent row of implanted channel regions. The method of the present invention continues with the formation of a plurality of strips of second insulation material so that each strip of second insulation material is formed over a portion of one common source bit line. Next, a plurality of strips of spacer material are formed so that each strip of spacer material covers a portion of each drain region and each horizontally-adjacent field oxide region in each row of drain regions, and adjoins one word line, the underlying stacked gate structures, and the overlying layer of first insulation material. A plurality of intermediate interconnect strips are then formed over the strips of second insulation material, the strips of spacer material, the layers of first insulation material, and the exposed portion of each drain region so that each intermediate interconnect strip interconnects the exposed portion of each drain region in one column of drain regions. Next, a layer of third insulation material, which has a plurality of metal bit line openings formed through the layer of third insulation material, is formed over the strips of second insulation material, the strips of spacer material, the layers of first insulation material, the semiconductor substrate, and the plurality of intermediate interconnect strips so that each intermediate interconnect strip is periodically exposed by a metal bit line opening. Following this, a plurality of metal bit lines are formed over the layer of third insulation material and the exposed portion of each intermediate interconnect strip so that each metal bit line interconnects the exposed portions of one intermediate interconnect strip.

A better understanding of the features and advantages of the invention will be obtained by reference to the following detailed description and accompanying drawings which set forth an illustrative embodiment in which the principles of the invention are utilized.

BRIEF DESCRIPTION OF THE DRAWINGS

FIG. 10 is a cross-sectional view taken along lines 7A—7A of FIG. 7 illustrating the structure that results after the formation of the layer of second oxide 118.

FIG. 12 is a cross-sectional view taken along lines 7A—7A of FIG, 7 illustrating the structure that results after the formation of the common source bit line mask 120.

DETAILED DESCRIPTION

FIGS. 3–7 show plan diagrams of a portion of a flash electrically programmable read-only-memory (EPROM) array 100 that illustrate the structure of the present invention. As described in greater detail below, the flash EPROM of the present invention reduces the area required by the metal bit line-to-drain contacts by utilizing a series of self-aligned, intermediate strips of conductive material to contact each of the drain regions in a corresponding number of columns of drain regions, and a corresponding series of metal bit lines to periodically contact the series of intermediate strips of conductive material, By utilizing intermediate strips of conductive material which are self-aligned to the drains of the memory cells of the array, the area required for each drain contact and, in turn, the area required by each memory cell, can be significantly reduced in size. By then utilizing the series of metal bit lines to only periodically contact the series of intermediate strips, conventional techniques can be utilized to form the metal bit line contacts.

Figure 1:
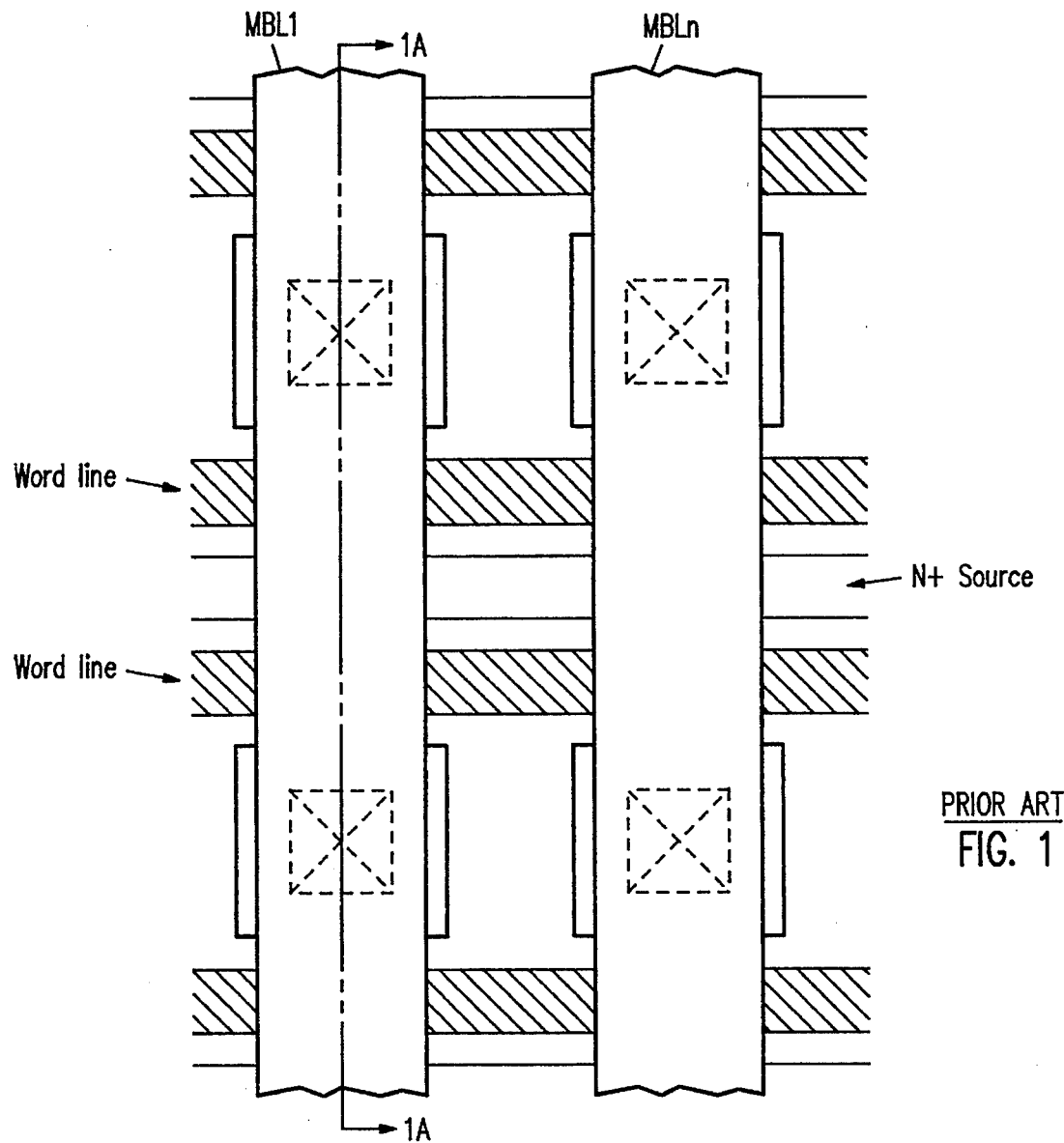
FIG. 1 iS a plan diagram illustrating a portion of conventional flash EPROM array.
Figure 2:
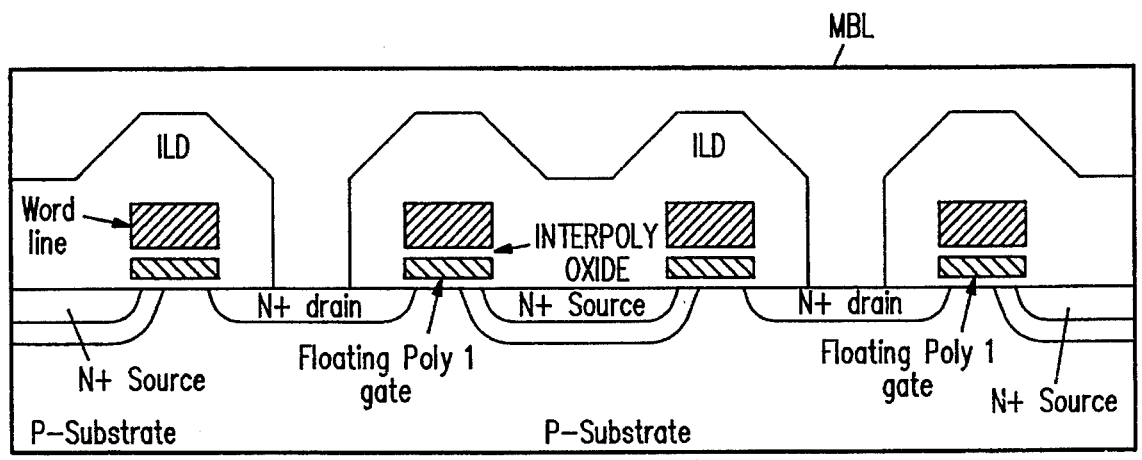
FIG. 2 is a cross-sectional diagram taken along lines 1A—1A of FIG. 1, FIGS. 3–7 are plan diagrams of a portion of a flash electrically programmable read-only-memory (EPROM) array 100 illustrating the structure of the present invention.
Figure 3:
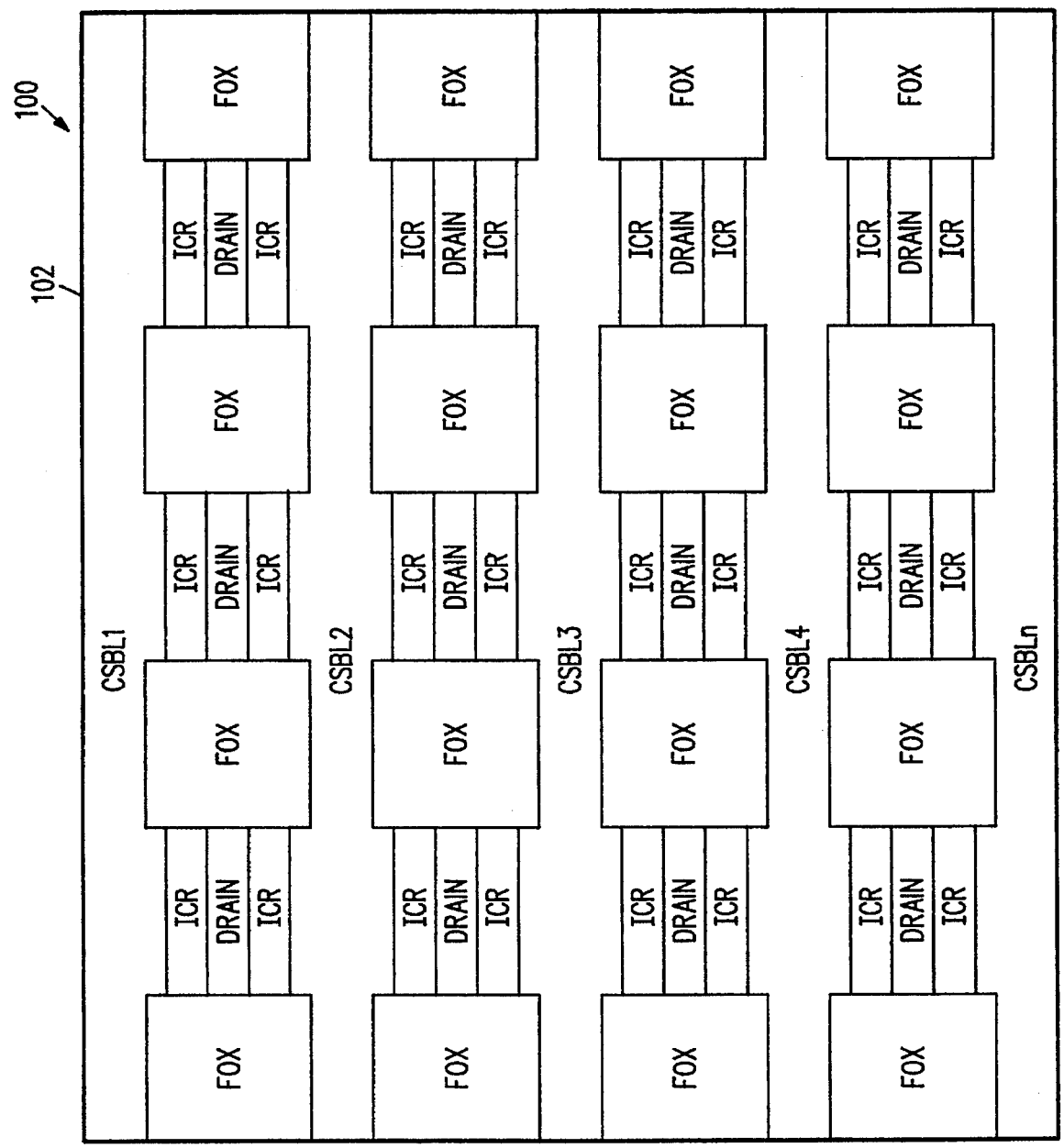

As shown in FIG. 3, flash EPROM array 100 includes an array of field oxide regions FOX which are formed on a semiconductor substrate 102 of P-type conductivity. Flash EPROM array 100 also includes an array of implanted channel regions ICRs which are formed in the semiconductor substrate 102 so that a pair of implanted channel regions ICRs are formed between each pair of horizontally-adjacent field oxide regions FOXs, and so that each implanted channel region ICR adjoins both of the adjacent field oxide regions FOXs. In addition, each implanted channel region ICR has a first side and a second side.

Flash EPROM array 100 further includes a plurality of N+ drain regions DRAIN which are formed in the semiconductor substrate so that each drain region DRAIN adjoins the first side of each pair of implanted channel regions ICRs that are formed between each pair of horizontally-adjacent field oxide regions.

As further shown in FIG. 3, a series of N+ common source bit lines CSBL1–CSBLn are formed in the semiconductor substrate 102 so that the second side of each implanted channel region ICR formed in one row of implanted channel regions ICRs and the second side of each implanted channel region ICR formed in an adjacent row of implanted channel regions ICRs are adjoined by one common source bit line CSBL.

Figure 4:
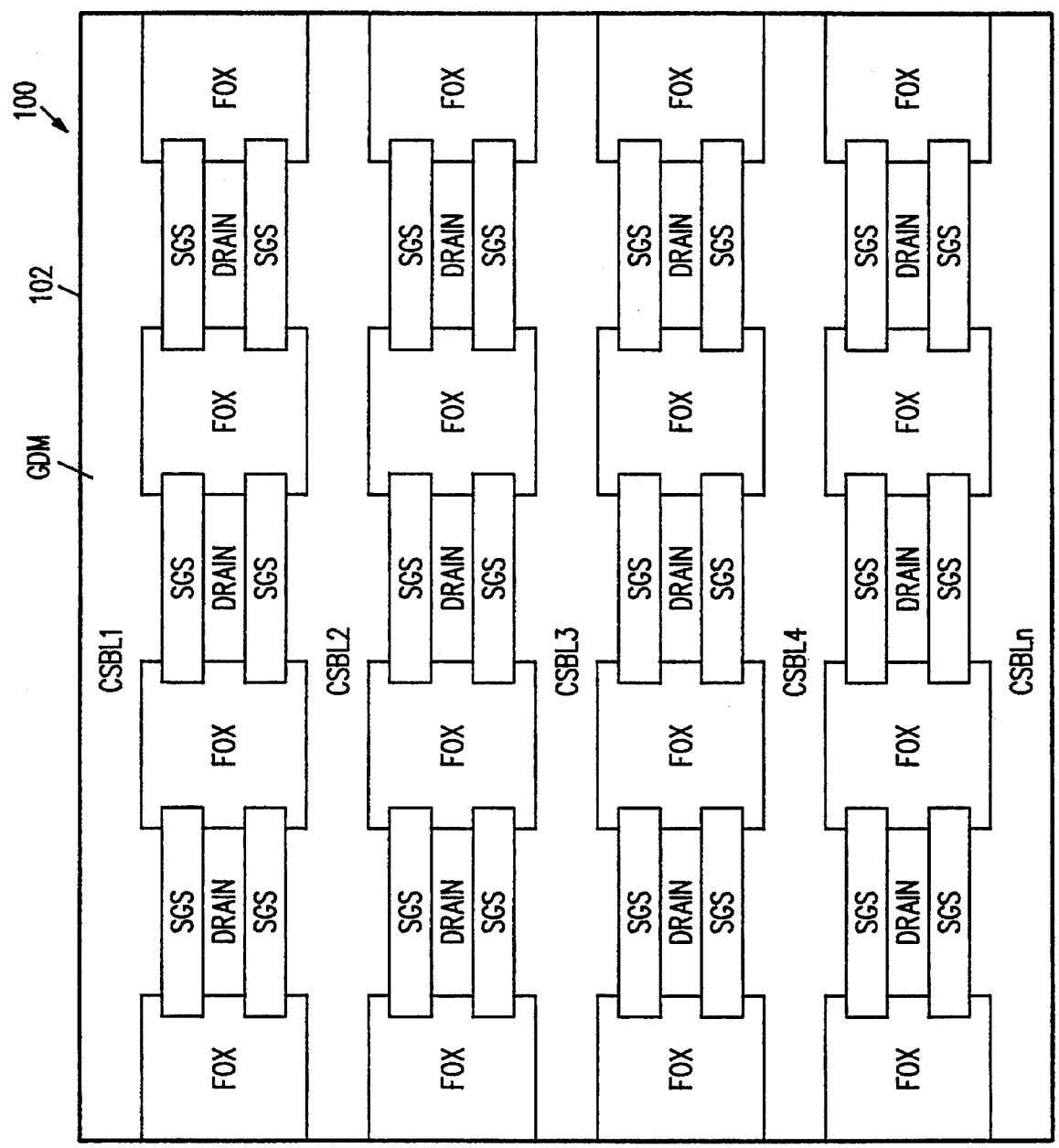

Referring to FIG. 4, a layer of gate dielectric material GDM is formed over the semiconductor substrate 102. An array of stacked gate structures SGSs are formed on the layer of gate dielectric material GDM so that each stacked gate structure SGS is formed over one implanted channel region ICR and a portion of each of the adjoining field oxide regions FOXs. As described in greater detail below, each stacked gate structure SGS includes a layer of polysilicon (poly1) which is formed over the layer of gate dielectric material GDM, a composite layer of oxide-nitride-oxide (ONO) which is formed over the layer of poly1, and a layer of edge oxide which is formed on the ends of the layers of poly1 and ONO. The layer of poly1 functions as the floating gate of the cell. The layer of edge oxide insulates the layer of poly1 from the to be formed word lines.

Figure 5:
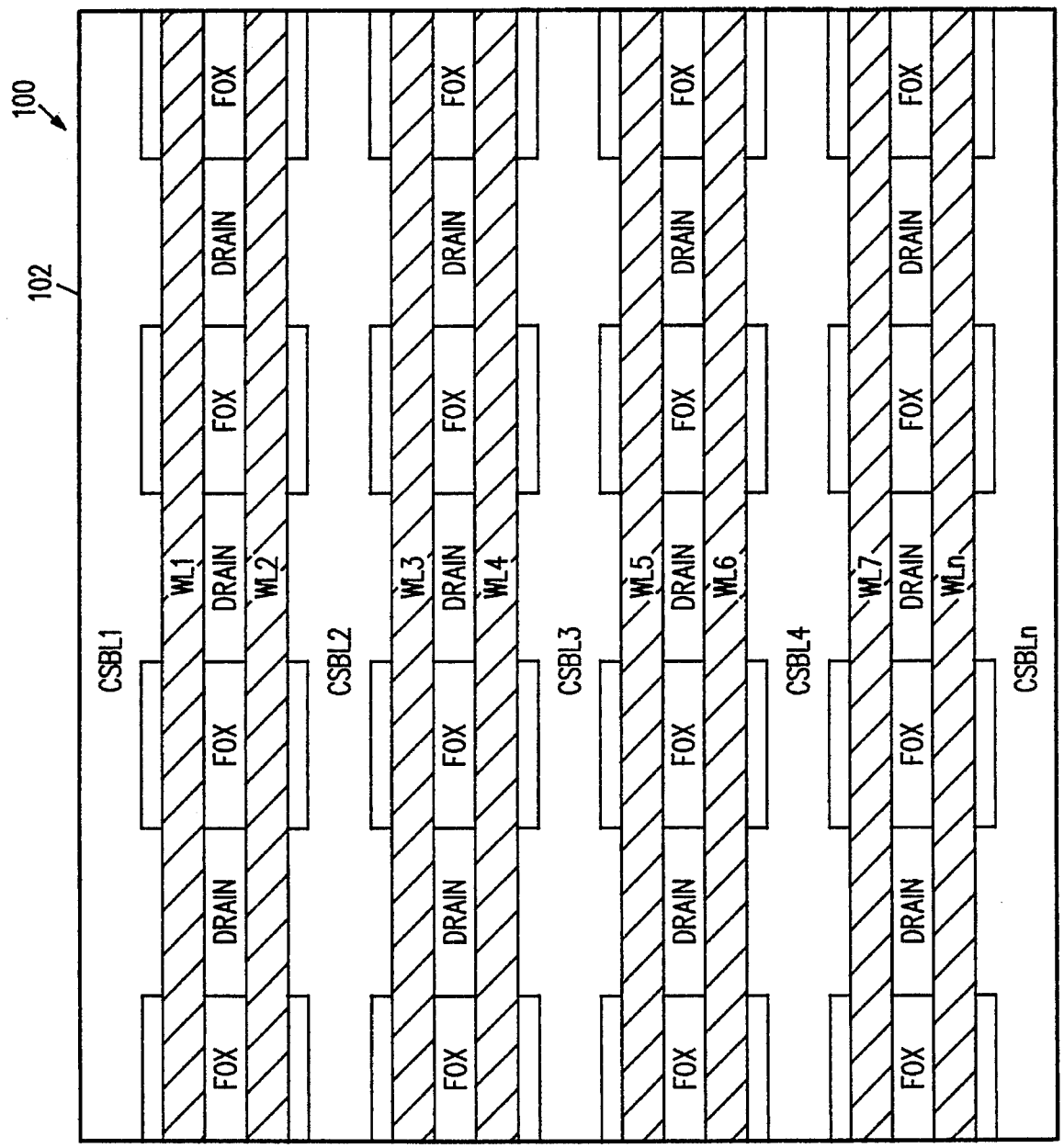

Referring to FIG. 5, EPROM array 100 also includes a series of word lines WL1–WLn which are formed on the layer of gate dielectric material GDM and the stacked gate structures SGSs so that each word line WL is formed over and interconnects all of the stacked gate structures SGSs in one row of stacked gate structures SGSs. Each word line WL, in turn, is covered with a layer of first insulation material (see reference numeral 111, FIG. 9).

As described in greater detail below, the word lines WLs preferably include a layer of polysilicon (poly2) and an overlying layer of tungsten silicide. The portion of the layer of poly2 and tungsten silicide which is formed over the stacked gate structures SGSs functions as the control gate of the cell.

Figure 6:
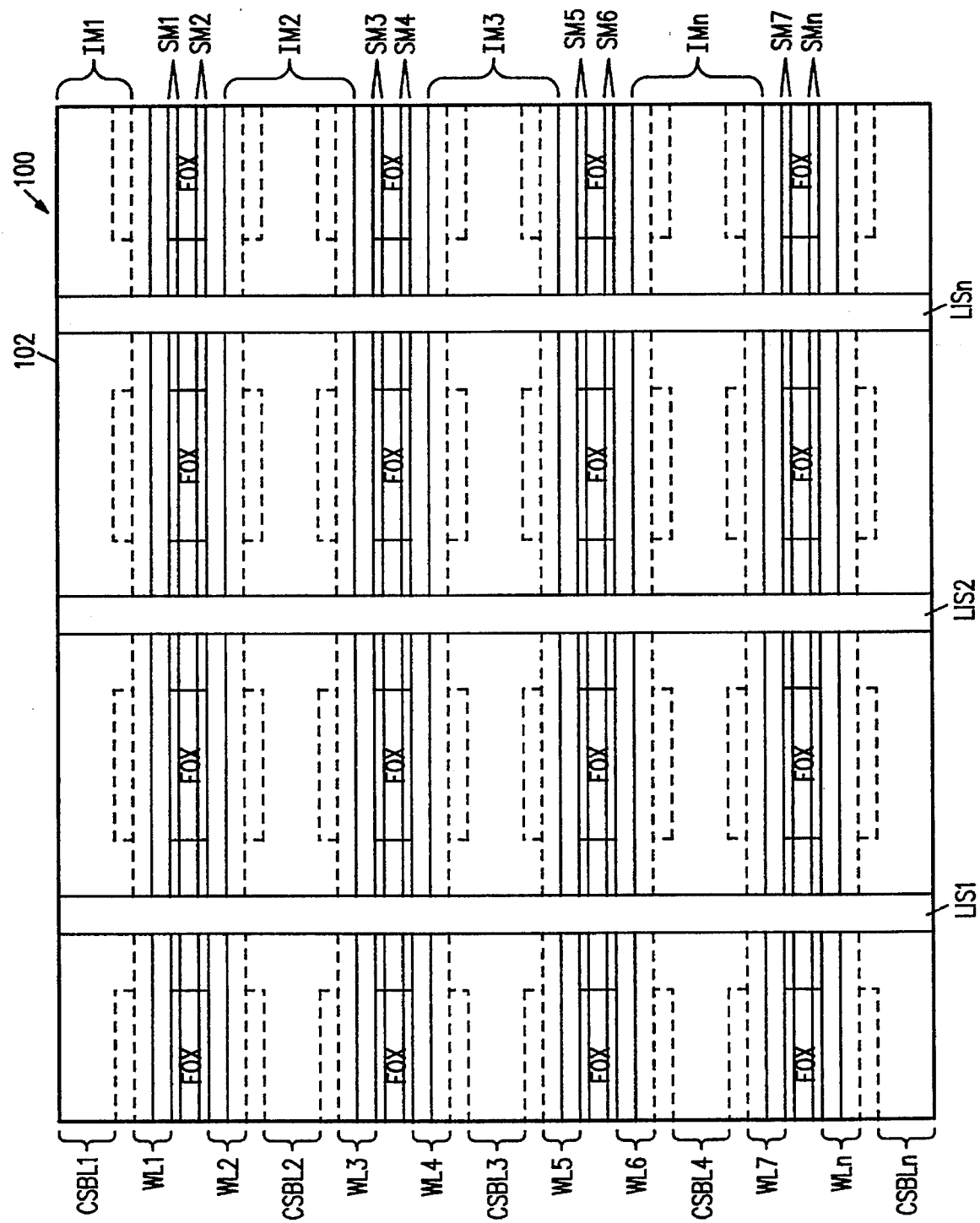

A series of strips of second insulation material IM1–IMn are formed so that each strip of second insulation material IM is formed over one common source bit line CSBL. As described in greater detail below and as shown in FIG. 6, in the preferred embodiment, to provide for any alignment error, each strip of second insulation material IM is also formed over a portion of the layer of first-insulation material that is formed over each adjoining word line WL, and a portion of each adjoining field oxide region FOX.

A series of strips of spacer material SM1–SMn are formed so that each strip of spacer material SM covers a portion of each drain region and each horizontally-adjacent field oxide region FOX in each row of drain regions, and adjoins one word line, the underlying stacked gate structures, and the overlying layer of first insulation material. Each drain region in each column of drain regions is then connected together by one of a series of intermediate interconnect strips LIS1–LISn which are formed over the series of strips of second insulation material IM1–IMn, the series of strips of spacer material SM1–SMn, the layers of first insulation material, and the drain regions.

Figure 7:
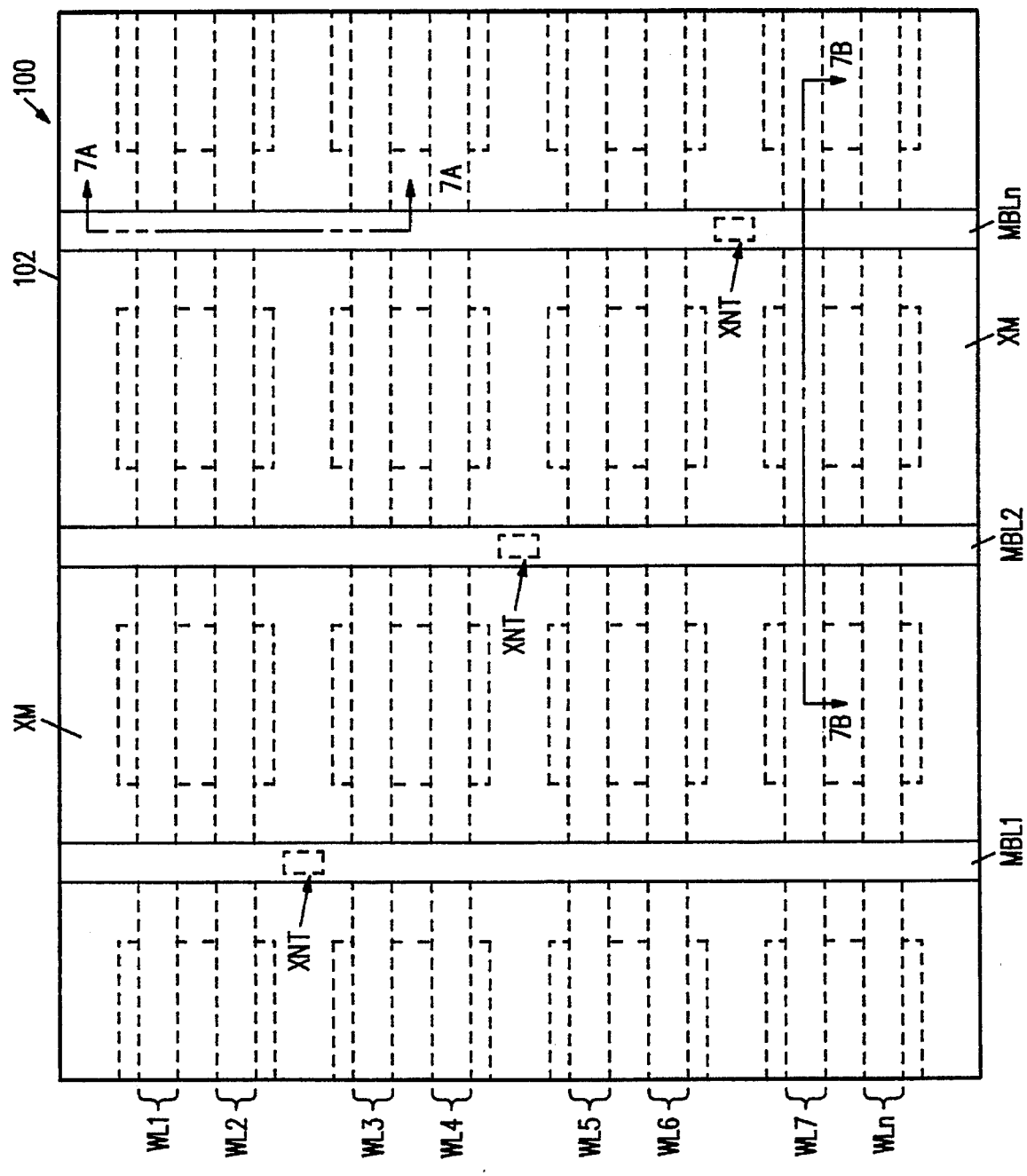

Referring to FIG. 7, a layer of third insulation material XM, which has a series of metal bit line openings XNT formed through the layer of third insulation material XM, is formed over the series of strips of second insulation material IM1–IMn, the series of strips of spacer material SM1–SMn, the word lines, the semiconductor substrate 102, and the series of intermediate interconnect strips LISs so that each intermediate interconnect strip LIS is periodically exposed by a metal bit line opening XNT. All of the exposed portions of each intermediate interconnect strip are then connected together by one of a series of metal bit lines MBL1–MBLn which are formed over the layer of third insulation material XM. In the preferred embodiment, each intermediate interconnect strip LIS is contacted by a metal bit line after either 16, 32, or 64 memory cells.

A process methodology will now be described for flash EPROM array 100 in accordance with the concepts of the present invention. The process of the present invention begins by forming the array of field oxide regions FOXs in the P-type semiconductor substrate 102.

The array of field oxide regions FOXs is first formed by growing a layer of pad oxide approximately 500 Å thick over the semiconductor substrate 102. This is followed by the deposition of an overlying layer of nitride. A field oxide mask is then formed over the nitride/pad oxide composite and patterned to define the array of field oxide regions FOXs.

Next, the unmasked areas are etched until the underlying pad oxide material is exposed. The field oxide mask is stripped and a field implant mask is then formed and patterned. The semiconductor substrate 102 underlying the unmasked areas is then implanted with $BF_2$ at 50 KeV to form an implant concentration of approximately $4 \times 10^{13}$/cm$^2$. Following this, the field implant mask is stripped and the resulting device is oxidized. The fabrication steps utilized to form the array of field oxide regions FOXs are conventional and well known in the art.

After the array of field oxide regions FOXs has been formed, the next step is to form the implanted channel regions. The implanted channel regions set the channel threshold voltages for each of the to-be-formed memory cells. The threshold voltages are first set by removing the nitride/pad oxide composite layer. Next, a layer of sacrificial oxide is grown on the exposed P-type semiconductor substrate 102, followed by the formation and patterning of a threshold voltage mask.

After the threshold voltage mask has been formed and patterned, the semiconductor substrate 102 underlying the unmasked areas of sacrificial oxide is then implanted with $B^{11}$ at 40 KeV to form an implant concentration of approximately $5 \times 10^{12}$/cm$^2$. Following this, the threshold voltage mask is stripped and the layer of sacrificial oxide is removed. As is well known, the preceding fabrication steps are conventional.

After the layer of sacrificial oxide has been removed, a layer of first gate oxide 104 is grown on the P-type semiconductor substrate 102 approximately 100–120 Å thick to form the gate dielectric material GDM. Next, a layer of polysilicon (poly1) 106 is deposited on the underlying layer of first gate oxide 104 to a thickness of about 1,500 Å and doped in a conventional manner. As stated above, the layer of poly1 106 will serve as the floating gate for the flash EPROM cells of the array. A composite dielectric layer of oxide/nitride/oxide (ONO) 108 is then formed on the layer of poly1 106.

Figure 8:
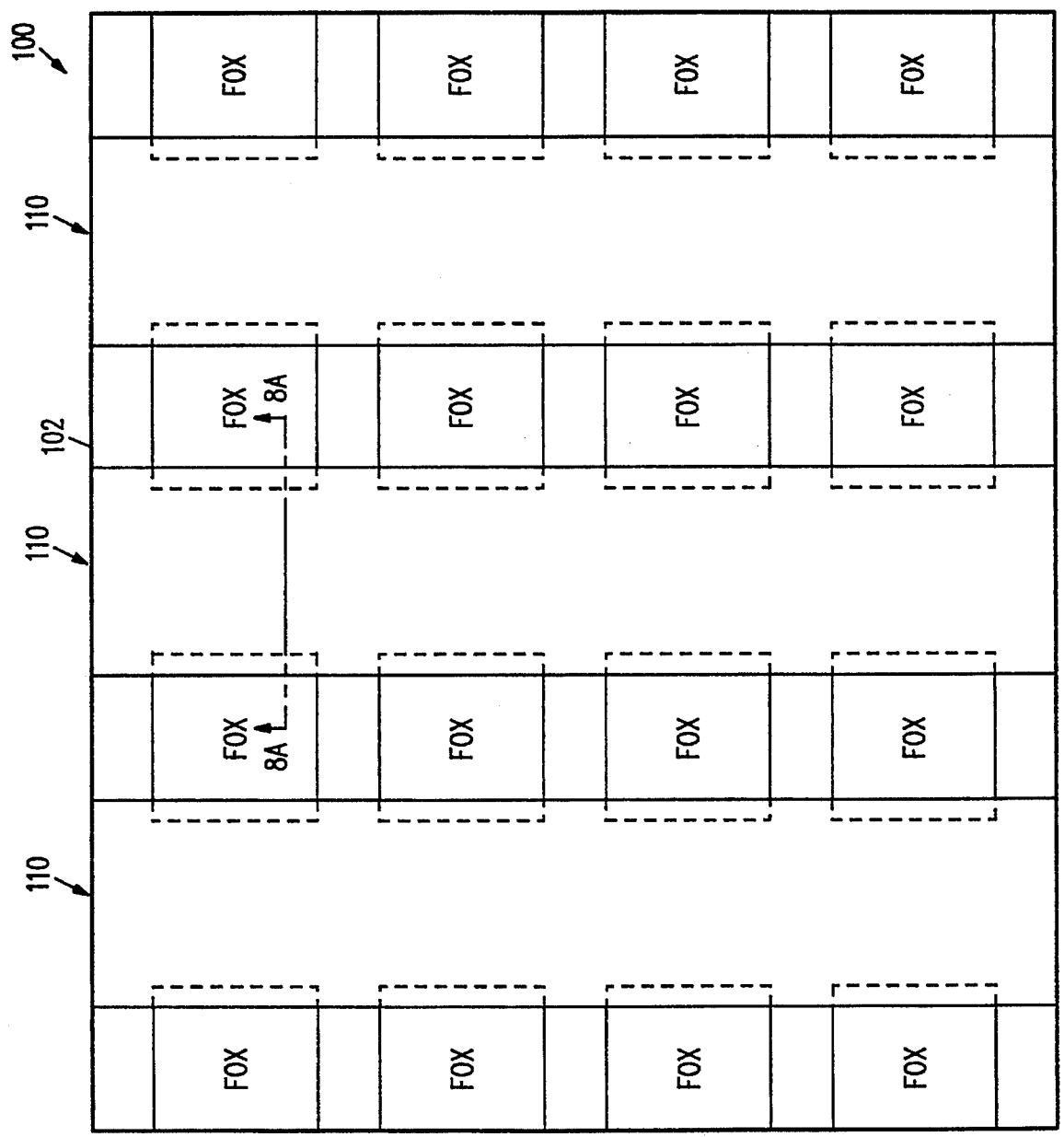
FIG. 8 is a plan view illustrating the series of strips of ONO/poly 110.
Figure 9:
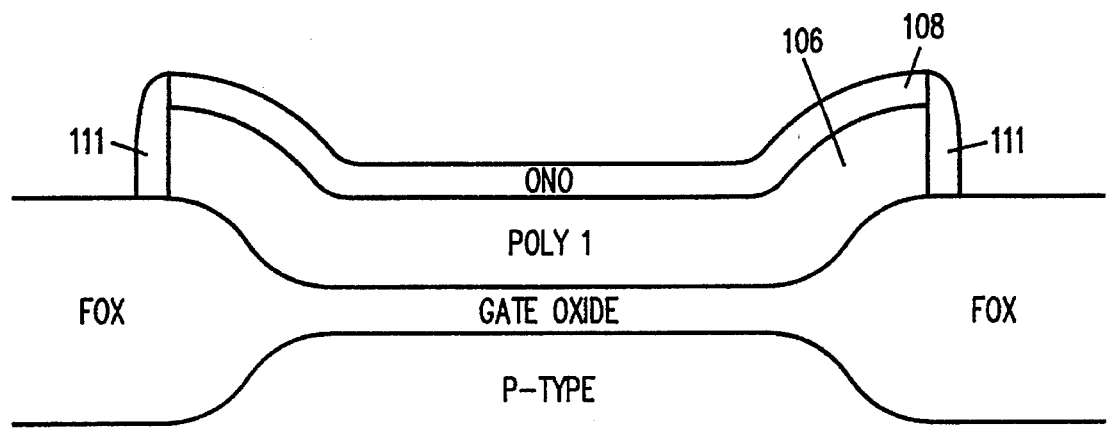
FIG. 9 is a cross-sectional view taken along lines 8A—8A of FIG. 8.

After forming the layer of ONO 108, a photoresist mask is formed and patterned to define strips on the layer ONO 108. The unmasked areas of the ONO/poly1 composite are then plasma etched to form a series of parallel strips of ONO/poly1 110. After the strips of ONO/poly1 110 have been formed, the poly1 mask is removed and a thin layer of edge oxide 111 is grown on the sidewalls of the strips of ONO/poly1 110 to provide insulation from the to be formed control gate. FIG. 8 shows a plan view that illustrates the series of strips of ONO/poly1 110. FIG. 9 shows a cross-sectional view taken along lines 8A—8A of FIG. 8.

At this point, MOS transistors can optionally be formed around the periphery of the array. The typical flash EPROM includes a number of MOS transistors that function, for example, as current sense detectors and address decoders. Thus, when present, the next step is to form the MOS peripheral devices. When the MOS peripheral devices are not present, the next step is the formation of the word lines.

To form the peripheral MOS devices, a protect array mask is formed over the array region so that MOS transistors can be formed around the periphery of the array. Following the formation of the protect array mask, the layer of first gate oxide is etched from the periphery. Once the layer of first gate oxide has been removed, a layer of second gate oxide approximately 200 Å is grown on the P-type semiconductor substrate in the periphery. After the layer of second gate oxide has been grown, the next step is to set the channel threshold voltages for each of the to be formed MOS transistors in the periphery.

The threshold voltages are set by forming and patterning a threshold mask to define the channel regions, and then implanting a P-type dopant through the unmasked layer of second gate oxide. Following this, the threshold voltage mask and the protect array mask are stripped.

Next, a layer of second polysilicon (poly2) 112 approximately 1,500 Å is deposited over the surface of the entire device and doped in the conventional manner. In the preferred embodiment, this is followed by the deposition of an overlying layer of tungsten silicide 114 approximately 2,000 Å thick. As stated above, the composite layer of tungsten silicide/poly2 will serve as the control gate for the flash EPROM cells of the array. Next, in accordance with the present invention, a layer of first oxide 116 approximately 4,000 Å thick is deposited over the layer of tungsten silicide 114 to form the layer of first insulation material. Alternately, any equivalent material can be utilized to form the layer of first insulation material.

A word line mask is then formed over the first oxide/tungsten silicide/poly2 composite and patterned to define a series of word lines in the array and the gate electrodes of the peripheral MOS devices. Following this, the first oxide/tungsten silicide/poly2 composite is etched until the unmasked layers of first oxide, tungsten silicide, and poly2 have been removed.

After the first oxide/tungsten silicide/poly2 composite has been etched, the word line mask is UV-hardened and a self-aligned etch (SAE) mask is formed so that the overlying first oxide/tungsten silicide/poly2 composite can be used as a mask for a self-aligned etch of the ONO/poly1 composite. This then is followed by a stacked etch of the ONO/poly1 composite to define the stacked gate structure of each of the to-be-formed memory cells of the array.

After the self-aligned etch of the ONO/poly1 composite, the SAE mask is removed. Next, a source/drain mask is formed and patterned to define the N+ drain regions and the series of common source bit lines in the array, and the N+ source and drain regions of the MOS devices in the periphery. Once the source/drain mask has been formed, the P-type semiconductor substrate 102 underlying the unmasked areas is implanted with arsenic through the layer of first gate oxide 104 to a depth of 0.2 to 0.3 micrometers. The source/drain mask is then stripped.

Following this, a common source mask is formed and patterned. The common source bit lines are then implanted with a high voltage phosphorous implant. Next, the common source mask is stripped.

Next, in accordance with the present invention, a highly conformal process, such as chemical vapor deposition, is utilized to deposit a layer of second oxide 118, such as tetra-ethyl-ortho-silicate (TEOS), approximately 4,000 Å thick over the entire structure to form the layer of second insulation material. Alternately, any equivalent material can be utilized to form the layer of second insulation material. FIG. 10 shows a cross-sectional view taken along lines 7A—7A of FIG. 7 that illustrates the structure that results after the formation of the layer of second oxide 118.

Figure 11:
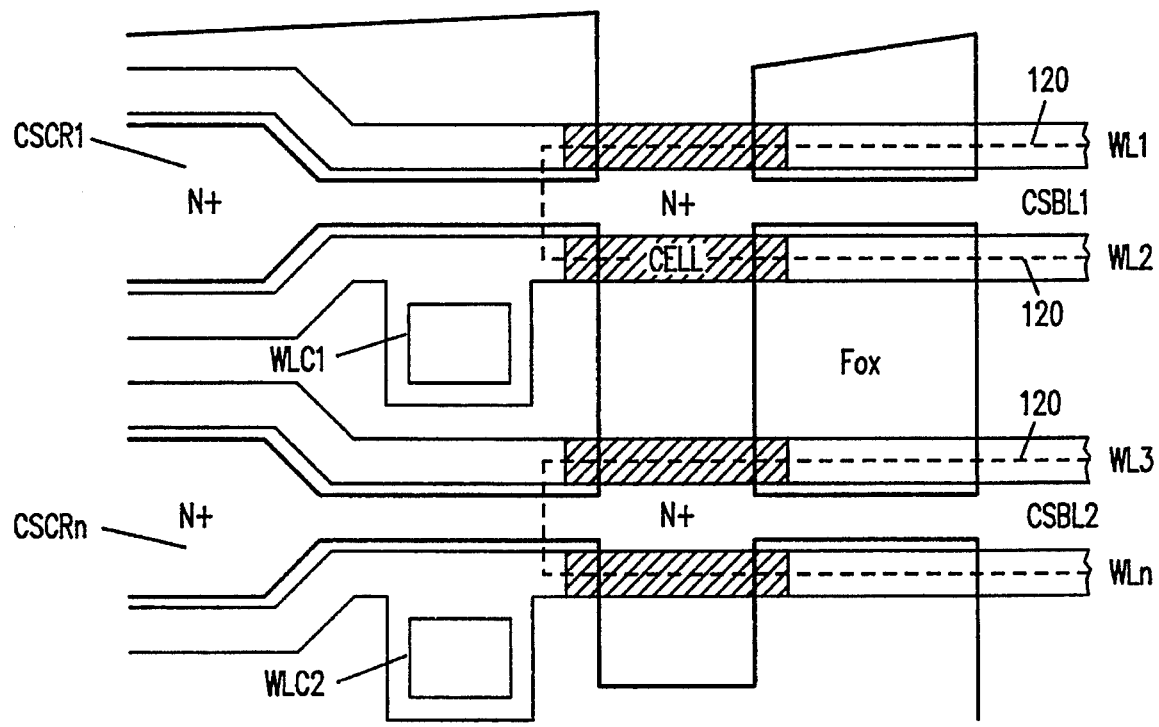
FIG. 11 is a plan view of a portion of the array illustrating the common source bit line mask 120 and the common source contact regions CSCRs.

After the layer of second oxide 118 has been deposited, a protect common source bit line mask 120 is formed over the layer of second oxide 118 to protect the common source bit lines CSBLs except for a series of common source contact regions CSCR1–CSCRn and a corresponding portion of the common source bit lines CSBLs adjoining the common source contact regions CSCRs. FIG. 11 shows a plan view of a portion of the array that illustrates the protect common source bit line mask 120, the series of common source contact regions CSCR1–CSCRn, and a corresponding portion of the common source bit lines CSBLs adjoining the common source contact regions CSCRs.

After the protect common source bit line mask 120 has been formed and patterned, the unmasked areas are anisotropically etched until the layer of second oxide 118 is removed from a portion of each drain, thereby forming strips of spacer material 119. Each strip of spacer material 119 adjoins one word line, the underlying stacked gate structures, and the overlying layer of first oxide 116. FIG. 12 shows a cross-sectional view taken along lines 7A—7A of FIG. 7 that illustrates the structure that results after the layer of second oxide 118 has been removed. In accordance with the present invention, the to-be-formed intermediate strips of conductive material are self-aligned as a result of the formation of strips of spacer material 119.

As shown in FIG. 12, to insure that none of the layer of second oxide 118 formed over the common source bit lines CSBLs is removed during the etching step, the protect source mask 120 is formed to cover a portion of the layer of first oxide 116. More importantly, however, is that the present invention allows for a substantial alignment error. Thus, if the protect common source bit line mask 120 is misaligned, the mask will still function properly as long as the trough region of the layer of second oxide 118 formed over the common source bit lines CSBLs cannot be etched.

Figure 13:
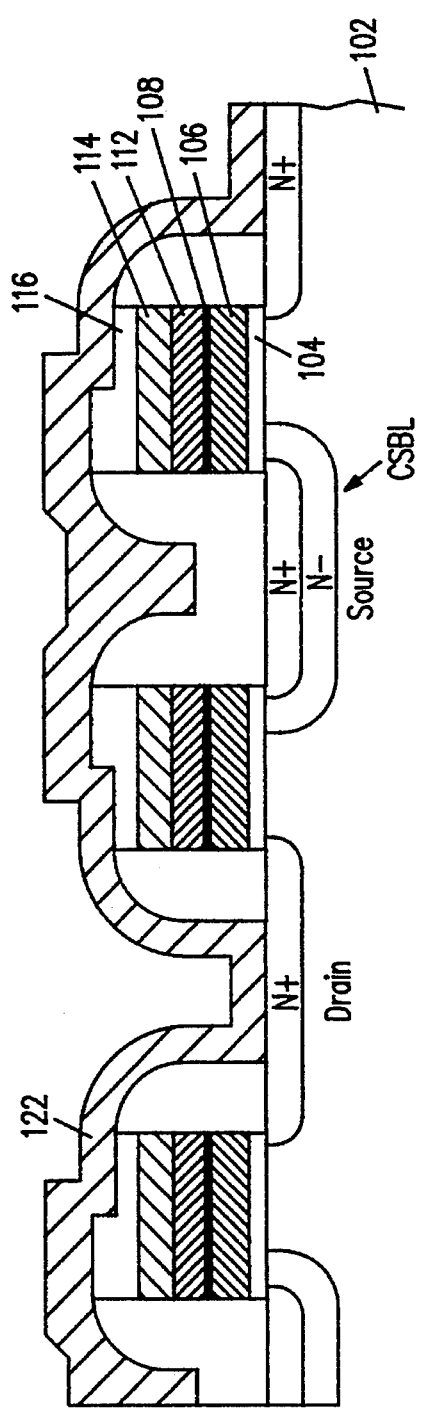
FIG. 13 is a cross-sectional view taken along lines 7A—7A of FIG, 7 illustrating the structure that results after the deposition of the layer of conductive material 122.

Following this, the series of intermediate interconnect strips are formed so that each strip contacts each of the drain regions in one column of drain regions. The series of intermediate interconnect strips are first formed by depositing a layer of conductive material 122 approximately 1,000 Å thick over the entire array. The layer of conductive material 122 can include any refractory metal, such as, W (tungsten), TiW (titanium tungsten), or TiN (titanium nitride). FIG. 13 shows a cross-sectional view taken along lines 7A—7A of FIG. 7 that illustrates the structure that results after the deposition of the layer of conductive material 122.

As shown in FIG. 13 and as described above, the layer of conductive material 122 is self-aligned to the drains of the memory cells as a result of the strips of spacer material 119. Thus, the excess area which is conventionally required to allow for misalignment is no longer required. Further, due to the conformal nature of the layer of conductive material 122, the size of the exposed portion of the drain region can be reduced to its practical minimum.

In addition, as further shown in FIG. 13, both the layer of first oxide 116, the layer of second oxide 118, and the strip of spacer material 119 function to isolate the layer of conductive material 122 from the floating gate 106, the control gate 112, and the common source bit lines CSBLs.

After the layer of conductive material 122 has been deposited, an interconnect mask is formed and pattered to define the series of intermediate interconnect strips. Next, the unmasked areas are etched until the unwanted layer of conductive material 122 is removed.

After the series of intermediate interconnect strips have been formed, a layer of borophosphosilicate glass (BPSG) 124 approximately one micron thick is deposited over the entire structure at 390° C. to form the layer of third insulation material. Alternately, any equivalent material can be utilized to form the layer of third insulation material. Once deposited, the layer of BPSG 124 is reflowed utilizing a rapid thermal processing (RTP) reflow to achieve a flat flow. Following this, a metal bit line contact mask is formed and patterned to define a series of metal bit line contact openings over each intermediate interconnect strip. Next, the unmasked areas of the layer of BPSG 124 are etched until the layer of conductive material 122 is exposed. The contact mask is then stripped.

Once the contact mask has been stripped, a layer of tungsten is deposited over the entire structure. Due to the highly conformal nature of tungsten, the layer of tungsten flows into and fills up each of the metal bit line contact openings. Next, the layer of tungsten is anisotropically etched until the layer of tungsten is removed from the top surface of the layer of BPSG 124. As a result, tungsten plugs 126 are formed in each of the metal bit line contact openings.

Figure 14:
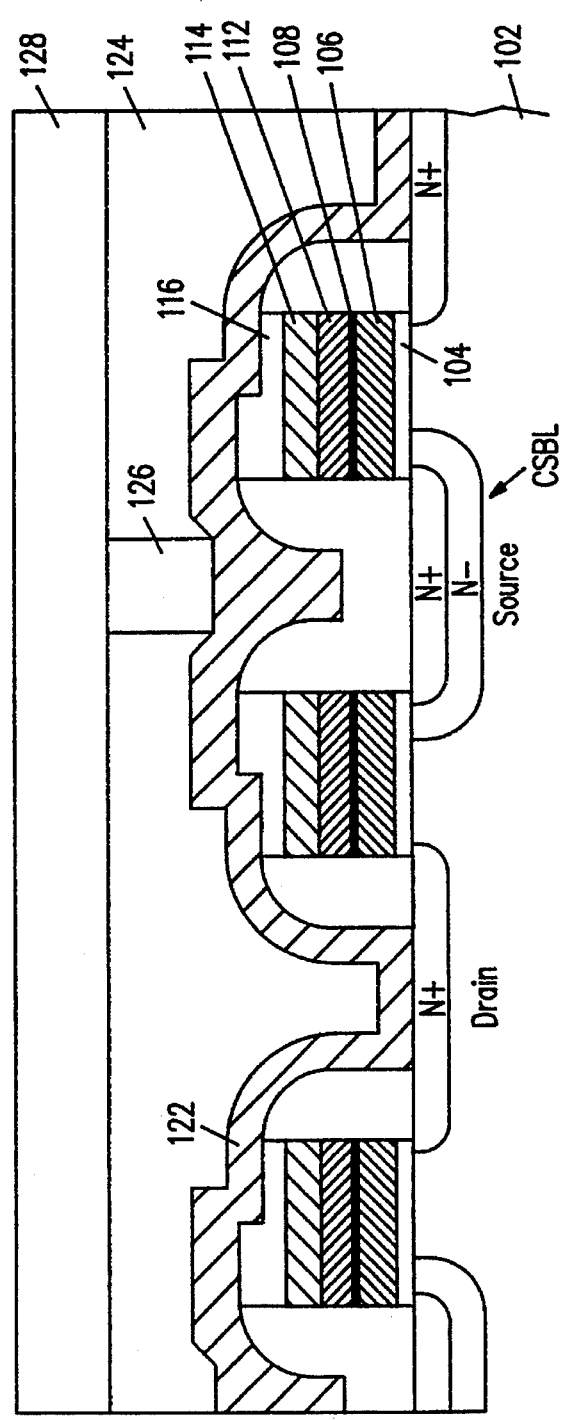
FIG. 14 is a cross-sectional view taken along lines 7A—7A of FIG. 7 illustrating the structure that results after the deposition of the layer of aluminum 128.

Following this, a layer of first metal (metal1) 128 is deposited over the entire structure. In the preferred embodiment, aluminum is utilized to form the layer of metal1 128. Next, a bit line mask is formed and patterned to define the metal bit lines. Following-this, the unmasked areas of the layer of metal1 128 are etched until the unwanted layer of metal1 128 is removed. The bit line mask is then stripped. FIG. 14 shows a cross-sectional view taken along lines 7A–7A of FIG. 7 that illustrates the structure that results after the deposition of the layer of metal1 128.

Alternately, the layer of metal1 128 can be utilized to directly contact the layer of conductive material 122, thereby eliminating the steps required to form the tungsten plugs 126. The disadvantage of utilizing the layer of metal1 128 to directly contact the layer of conductive material 122 is that, when aluminum is utilized as the layer of metal1, much larger metal bit line contact openings must be formed due to the non-conformal nature of aluminum.

Figure 15:
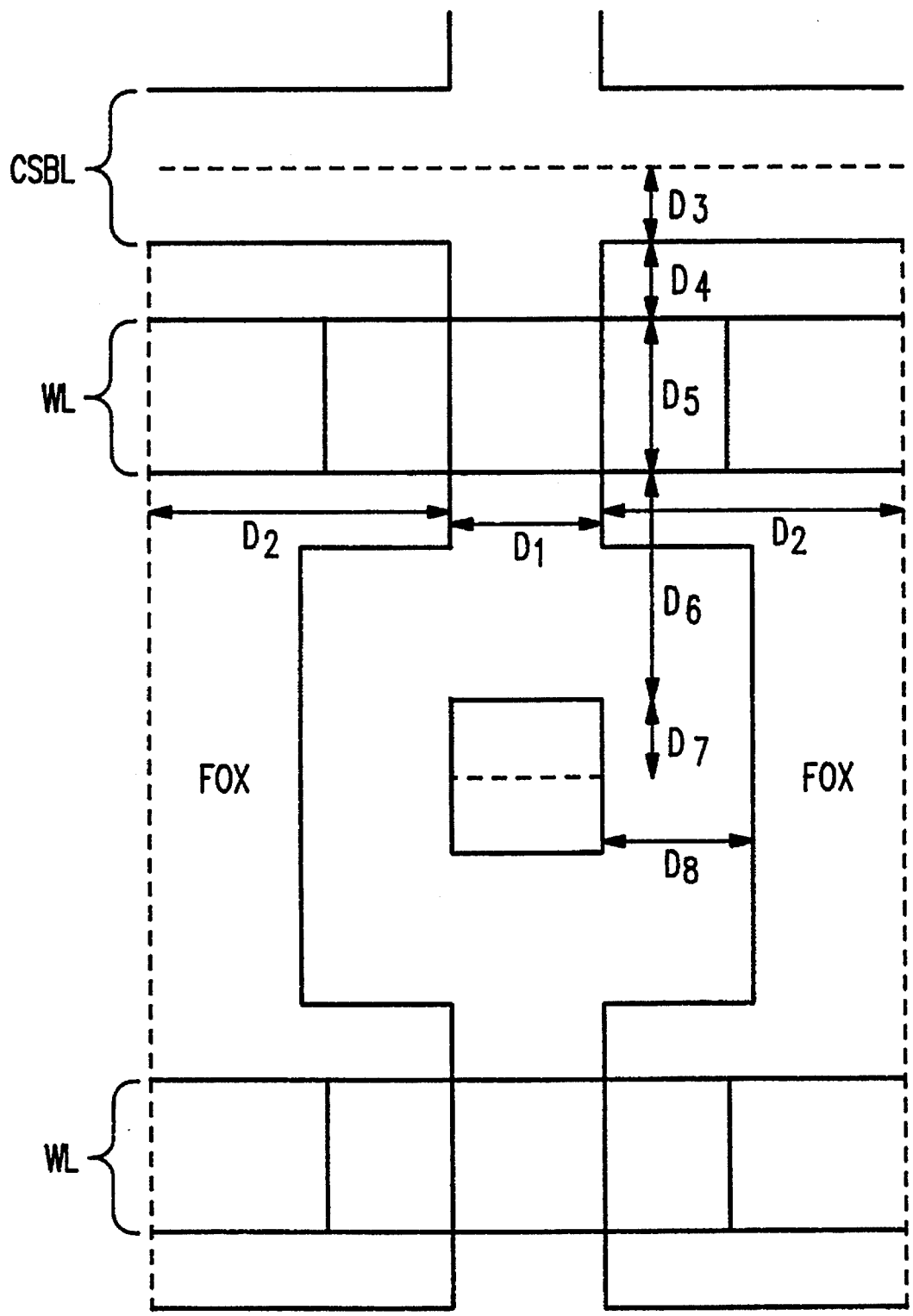
FIG. 15 is a plan diagram of a flash EPROM cell illustrating the reduction in size of the metal contact area in accordance with the present invention.

As stated above, by utilizing intermediate strips of conductive material which are self-aligned to the drains of the memory cells of the array, the size of the area required for each drain contact and, in turn, the size of the area required by each memory cell, can be significantly reduced. FIG. 15 shows a plan diagram of a flash EPROM cell that illustrates the reduction in size of the metal contact area in accordance with the present invention.

Typically, the area of a single cell is measured by the distance across the cell in the X direction multiplied by the distance across the cell in the Y direction. As shown in FIG. 15, the distance across a cell in the X direction is determined by the distance $D_1$ across the width of the channel which, in 0.5 micron technology, is typically 0.5 microns, and the distance $D_2$ from the center to the edge of the field oxide regions FOXs on both sides of the channel, which is typically 0.75 microns on each side. Thus, the total distance across the cell in the X direction is typically 2.0 microns.

The distance across the cell in the Y direction is determined by the distance $D_3$ from the center of the source bit line to the edge of the field oxide regions FOXs, which is typically 0.3 microns, the distance $D_4$ from the edge of the field oxide regions FOXs to the edge of the stacked gate structure, which is typically 0.2 microns, the distance $D_5$ across the width of the stacked gate structure, which is typically 0.5 microns, the distance $D_6$ from the edge of the stacked gate structure to the edge of the contact, which is typically 0.6 microns, and the distance $D_7$ from the edge to the center of the contact, which is typically 0.3 microns. Thus, the total distance across the cell in the Y direction is typically 1.9 microns. As a result, the area of a typical 0.5 micron flash EPROM cell is 3.8 square microns.

By utilizing the strips of spacer material 119 to self-align the layer of conductive material 122, however, the distance $D_6$ can be reduced from 0.6 microns to approximately 0.2 microns. This reduces the size of a cell in the Y direction from 1.9 microns to 1.5 microns. Further, the strips of spacer material 119 also allow the distance $D_8$ to be reduced, thereby relaxing the field oxide region FOX-to-field oxide region FOX design rules. As a result, the total area of the cell is reduced from 3.8 square microns to less than 3.0 square microns.

As stated above and as shown in FIG. 5, each word line WL is formed over and interconnects all of the stacked gate structures in one row of stacked gate structures. Conventionally, each word line WL is connected to an external voltage contact at each end of the word line WL. As is well known, when a read voltage is applied to the external voltage contacts of a word line WL, the voltage on the word line attains the read voltage a precharge time after the read voltage is applied due to the capacitance associated with each memory cell that is connected to the word line.

Figure 16:
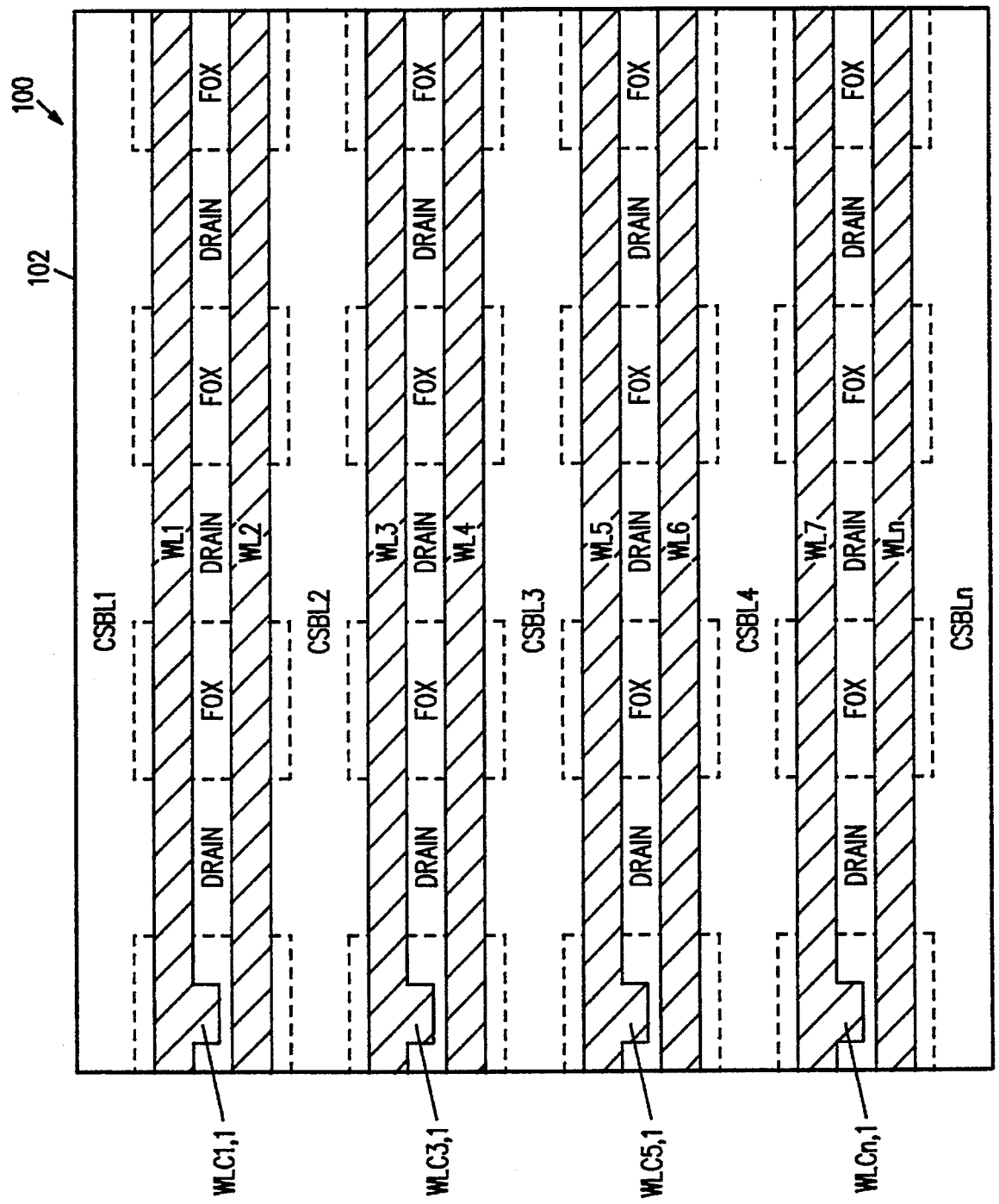
FIG. 16 is a plan view of a portion of the array illustrating the formation of the word line contact regions WLCs in accordance with another aspect of the present invention.

In another aspect of the present invention, the precharge time can be significantly reduced by periodically contacting each word line with a second metal strapping the word line. Thus, when the series of word lines WL1–WLn are formed on the layer of gate dielectric material GDM and the stacked gate structures SGSs as shown in FIG. 5, each word line WL1–WLn is also formed to periodically include a word line contact region WLCn, 1–WLCn,n as shown in FIG. 16.

Further, the layer of first insulation material, which is formed over each word line WL, has a series of first word line openings that periodically expose the word line contact regions WLCn, 1–WLCn,n on each word line. The layer of third insulation material, which, in part, is formed over the layer of first insulation material, also has a series of second word line openings formed through the layer of third insulation material so that one second word line opening coincides with one of the first word line openings in the layer of first insulation material.

In addition, flash EPROM 100 also includes a layer of fourth insulation material FIM which is formed over of the layer of BPSG and the strips of metal bit lines. The layer of fourth insulation material FIM has a series of third word line openings formed through the layer of fourth insulation material FIM which coincide with the series of second word line openings formed in the layer of BPSG.

Figure 17:
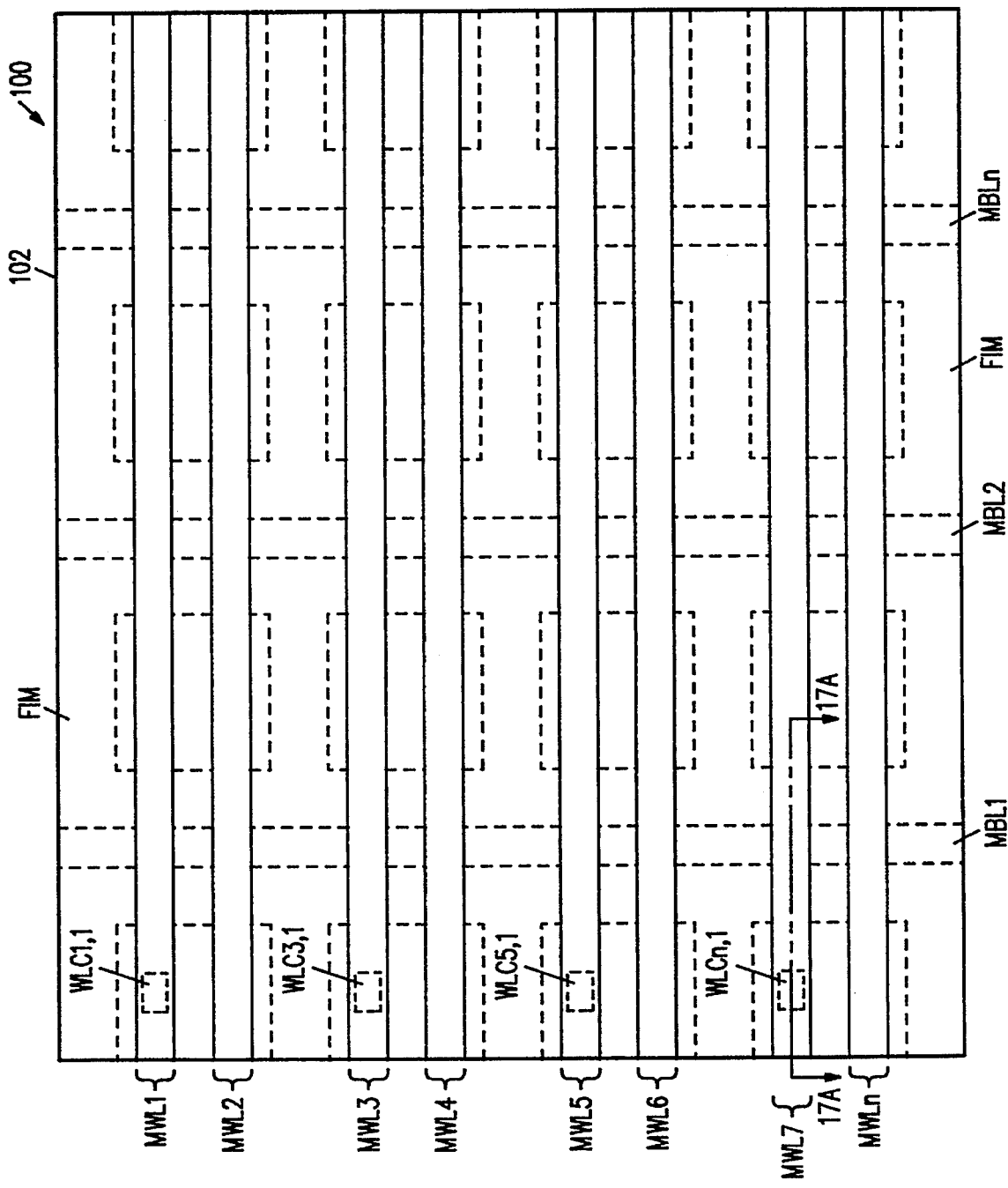
FIG. 17 is a plan view illustrating the layer of fourth insulation material FIM and the series of metal word lines MWL1–MWLn.

All of the word line contact regions WLCn, 1–WLCn, of each word line are then connected together by one of a series of metal word lines MWL1–MWLn which are formed over the layer of fourth insulation material FIM. In the preferred embodiment, each word line is contacted by a metal word line MWL after either 16 or 32 memory cells. FIG. 17 shows a plan view that illustrates the layer of fourth insulation material FIM and the series of metal word lines MWL1–MWLn.

Figure 18:
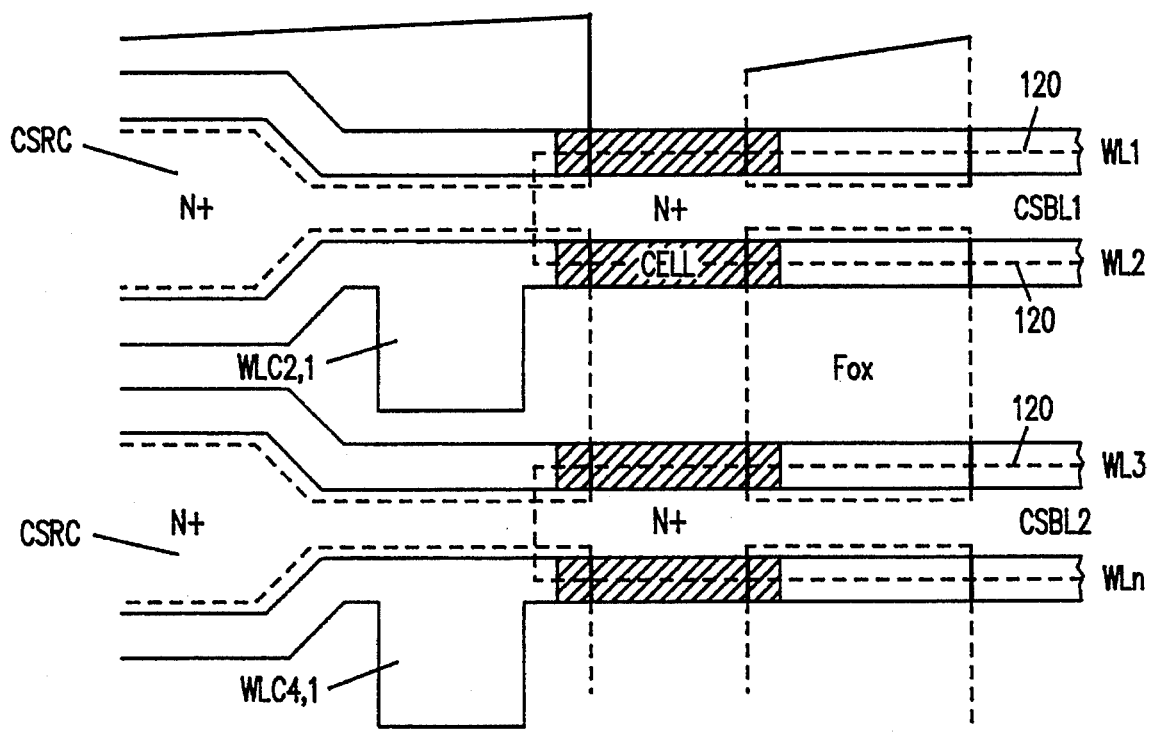
FIG. 18 is a plan view of a portion of the array illustrating the formation of the word line contact regions WLCn, 1–WLCn,n.

Referring back to FIG. 16, one apparent difficulty with the word line contact regions WLCn, 1–WLCn,n is that the word line contact regions WLCn, 1–WLCn,n limit the spacing between adjacent word lines. FIG. 18 shows a plan view of a portion of the array that illustrates the formation of the word line contact regions WLCn,1–WLCn,n.

Figure 19:
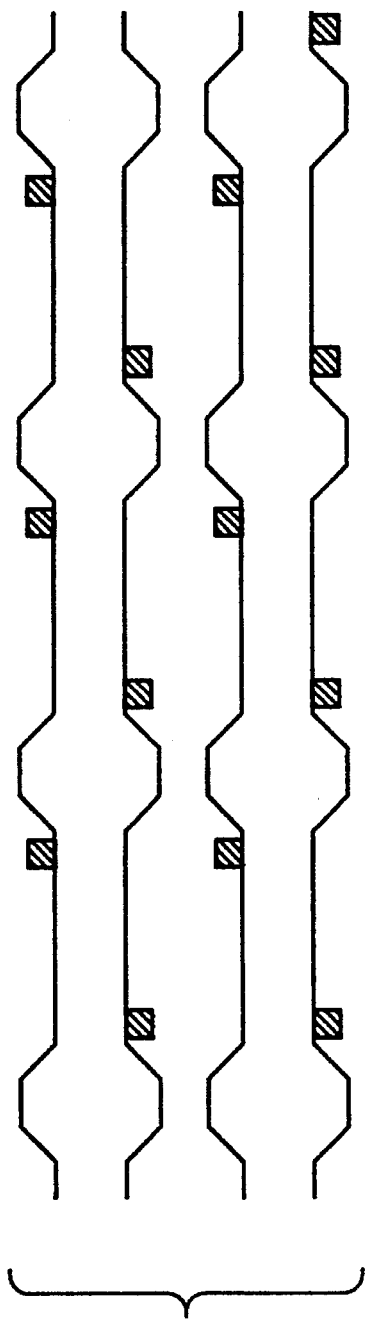
FIGS. 19 and 20 are schematic representations of staggered metal word line contacts WLCs formed every 16 and 32 cells, respectively.
Figure 20:
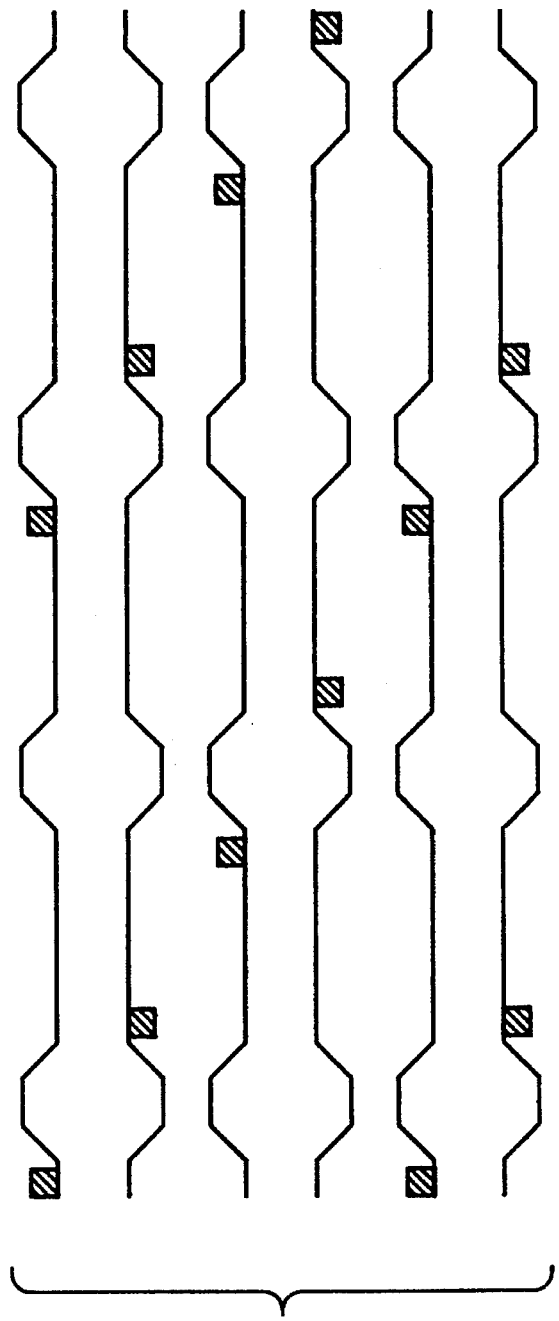

As shown in FIG. 18, the word lines WLs periodically move outward and around each common source contact region CSCR to provide sufficient space for the common source bit line contact to be made. As can be seen in FIG. 18, this also limits the spacing between adjacent word lines. Thus, as further shown FIG. 18, the word line contact regions WLCn, 1–WLCn,n can be formed without limiting the spacing between adjacent word lines. FIGS. 19 and 20 show a schematic representation two examples of metal word line contacts WLCs formed every 16 and 32 cells, respectively. By staggering the metal word line contacts WLCs as shown in FIGS. 19 and 20, the metal spacing design rules can be relaxed.

Figure 21:
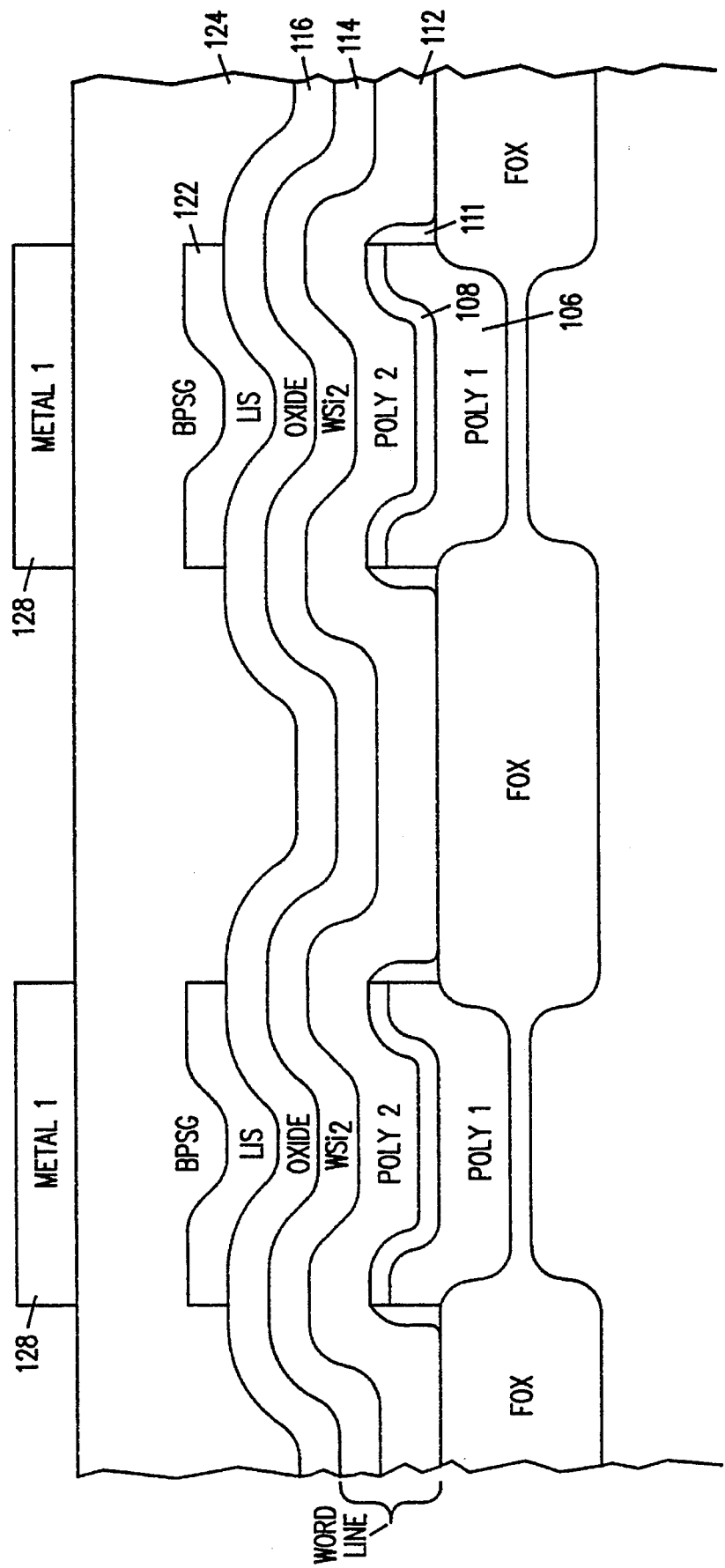
FIG. 21 is a cross-sectional view taken along lines 7B—7B of FIG. 7 illustrating the structure that results after the series of metal bit lines MBL1–MBLn have been formed from the layer of first metal 128.

The process of this aspect of the present invention begins after the layer of metal1 128 has been etched to form the series of the metal bit lines MBL1–MBLn. FIG. 21 shows a cross-sectional view taken along lines 7B—7B of FIG. 7 that illustrates the structure that results after the series of metal bit lines MBL1–MBLn have been formed.

After the bit line mask has been stripped, a composite intermetal dielectric layer of plasma-enhanced chemically-vapor-deposited oxide/spin-on-glass/plasma-enhanced chemically-vapor-deposited oxide (OGO) 134 is formed over the layer of BPSG 124 and the strips of metal1 128 to form the layer of fourth insulation material. Alternately, any equivalent material can be utilized to form the layer of fourth insulation material. Following this, a word line contact mask is formed over the layer of OGO 134 and patterned to define a series of word line openings so that each word line is periodically exposed by a word line opening.

Next, the unmasked areas of the layer of OGO 134 and the underlying layers of BPSG 124 and first oxide 116 are etched until the layer of tungsten silicide 114 (or the layer of poly2 112 if the layer of tungsten silicide 114 is omitted) is exposed. The word line contact mask is then stripped. Once the word line contact mask has been stripped, a layer of tungsten is deposited over the entire array. Due to the highly conformal nature of tungsten, the layer of tungsten flows into and fills up each of the word line openings. Next, the layer of tungsten is anisotropically etched until the layer of tungsten is removed from the top surface of the layer of OGO 134. As a result, tungsten plugs 136 are formed in each of the word line openings.

Figure 22:
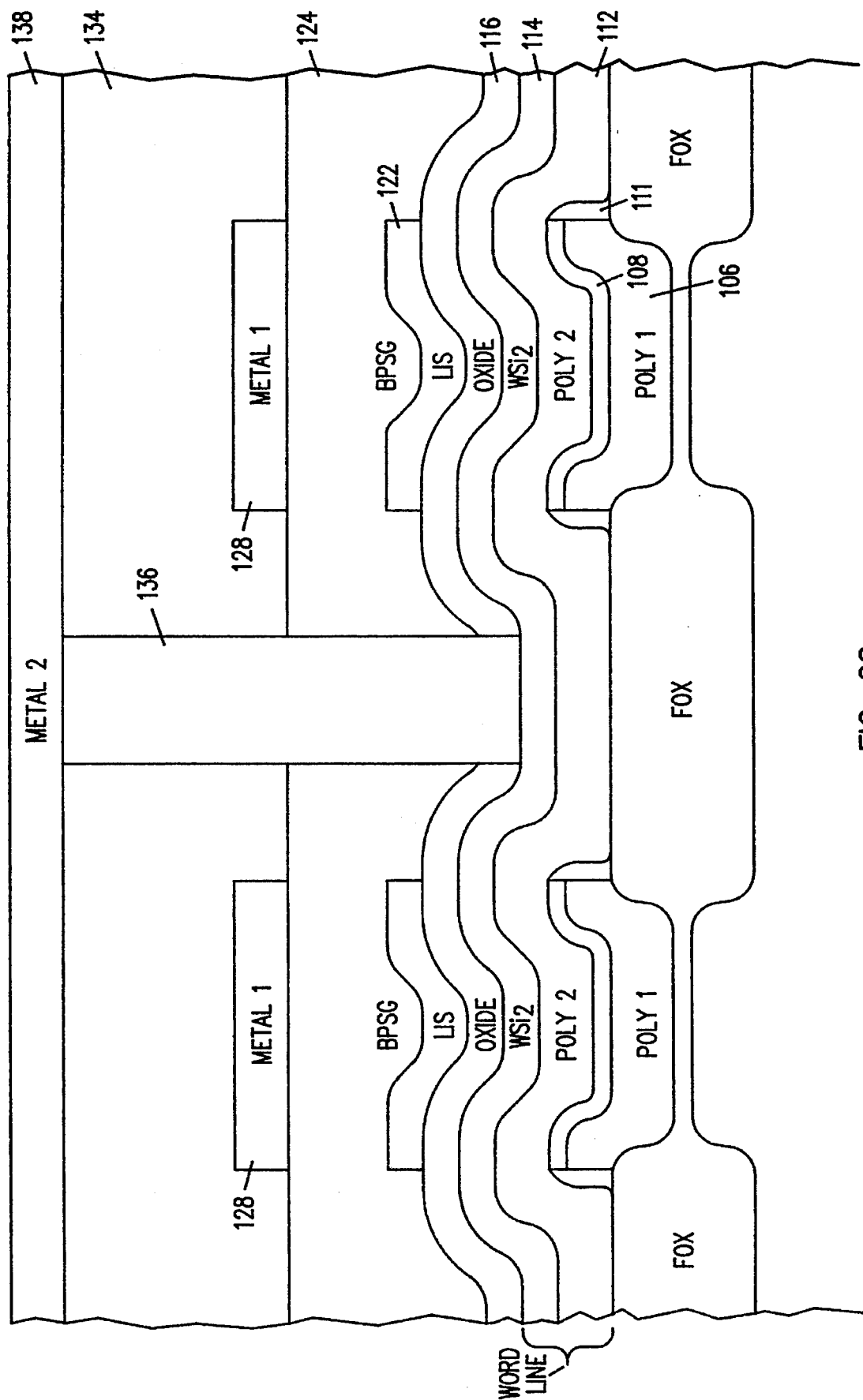
FIG. 22 is a cross-sectional view taken along lines 17A—17A of FIG. 17 illustrating the structure that results after the layer of second metal 138 has been deposited.

Following this, a layer of second metal (metal2) 138 is deposited over the entire structure. In the preferred embodiment, aluminum is utilized to form the layer of metal2 138. Next, a second metal mask is formed and patterned to define the metal word lines. Following this, the unmasked areas of the layer of metal2 138 are etched until the surface of the layer of OGO 134 is exposed. FIG. 22 shows a cross-sectional view taken along lines 17A—17A of FIG. 17 that shows the structure that results after the layer of metal2 138 has been deposited.

Alternately, the layer of metal2 138 can be utilized to directly contact the layer of tungsten silicide 114, thereby eliminating the steps required to form the tungsten plugs 136. The disadvantage of utilizing the layer of metal2 138 to directly contact the layer of tungsten 114, as above, is that, much larger word line openings must be formed due to the non-conformal nature of aluminum.

It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A method of fabricating the array of a high-density flash electrically programmable read-only-memory (EEPROM), the method comprising the steps of:

providing a semiconductor substrate of P-type conductivity;

forming a plurality of spaced-apart field oxide regions on the semiconductor substrate;

forming a plurality of first implanted channel regions in the semiconductor substrate so that a pair of first implanted channel regions are formed between each pair of horizontally-adjacent field oxide regions, and so that each first implanted channel region adjoins both of the adjacent field oxide regions, each implanted channel region having a first side and a second side;

forming a layer of first gate dielectric material on the semiconductor substrate;

forming a layer of first conductive material over the layer of first gate dielectric material;

forming a layer of intermediate dielectric material over the layer of first conductive material;

etching the layer of intermediate dielectric material and the layer of first conductive material to define a plurality of strips of dielectric/conductive material;

forming a layer of second conductive material over the strips of dielectric/conductive material, the field oxide regions, and the semiconductor substrate;

forming a layer of third conductive material over the layer of second conductive material;

forming a layer of first insulation material over the layer of third conductive material;

etching the layer of first insulation material, the layer of third conductive material, and the layer of second conductive material to form a plurality of word lines;

etching the layer of intermediate dielectric material and the layer of first conductive material to form a plurality of floating gate memory cells;

forming a plurality of N+ buried drain regions in the semiconductor substrate so that each drain region adjoins the first side of each pair of implanted channel regions;

forming a plurality of common source bit lines in the semiconductor substrate so that the second side of each implanted channel region formed in one row of implanted channel regions and the second side of each implanted channel region formed in an adjacent row of implanted channel regions are adjoined by one common source bit line;

forming a plurality of strips of second insulation material so that each strip of second insulation material is formed over one common source bit line;

forming a plurality of strips of spacer material so that each strip of spacer material covers a portion of each drain region and each horizontally-adjacent field oxide region in each row of drain regions, and adjoins one word line, the underlying stacked gate structures, and the overlying layer of first insulation material;

forming a plurality of intermediate interconnect strips over the strips of second insulation material, the strips of spacer material, the layers of first insulation, and the drain regions so that each intermediate interconnect strip interconnects each drain region in one column of drain regions;

forming a layer of third insulation material having a plurality of metal bit line openings formed therethrough over the strips of second insulation material, the strips of spacer material, the layers of first insulation material, the semiconductor substrate, and the plurality of intermediate interconnect strips so that each intermediate interconnect strip is periodically exposed by a metal bit line opening; and forming a plurality of metal bit lines over the layer of third insulation material and the exposed portion of each intermediate interconnect strip so that each metal bit line interconnects the exposed portions of one intermediate interconnect strip.

2. The method of claim 1 wherein the step of forming a plurality of intermediate interconnect strips comprises the steps of:

forming a layer of fourth conductive material over the strips of second insulation material, the layers of first insulation material, and the exposed portion of each drain region; and etching the layer of fourth conductive material to form a plurality of intermediate interconnect strips so that each intermediate interconnect strip interconnects the exposed portion of each drain region in one column of drain regions.

3. The method of claim 1 and further comprising the steps of:

removing the layer of first gate dielectric from a peripheral region;

forming a layer of second gate dielectric over the peripheral region; and forming a plurality of second implanted channel regions in the peripheral region.

4. The method of claim 1 wherein the layer of first insulation material comprises an oxide.

5. The method of claim 1 wherein each strip of second insulation material comprises a conformally deposited oxide.

6. The method of claim 1 wherein each intermediate interconnect strip comprises a refractory metal.

7. The method of claim 1 wherein the layer of third insulation material includes BPSG.

8. The method of claim 1 wherein each intermediate interconnect strip is exposed by a metal bit line opening after every 16 or 32 drain regions.

9. The method of claim 1 and further comprising:

forming a layer of fourth insulation material over the layer of third insulation material and the plurality of metal bit lines;

forming a series of word line openings in the layer of fourth insulation material, the layer of third insulation material, and the layers of first insulation material so that each word line is periodically exposed;

forming a plurality of metal word lines over the layer of fourth insulation material and the exposed portions of the word lines so that each metal word line interconnects the exposed portions of one word line.

10. The method of claim 9 wherein the layer of fourth insulation material includes a composite intermetal dielectric layer of a first plasma-enhanced-chemically-vapor-deposited oxide formed over the layer of third insulation material and the plurality of metal bit lines, a layer of spin-on-glass formed over the first plasma-enhanced oxide, and a second plasma-enhanced chemically-vapor-deposited oxide formed over the layer of spin-on-glass.

* * * * *